United States Patent
Murata et al.

(10) Patent No.: US 10,689,762 B2
(45) Date of Patent: Jun. 23, 2020

(54) SUBSTRATE PROCESSING APPARATUS, SUBSTRATE PROCESSING METHOD AND RECORDING MEDIUM

(71) Applicant: Tokyo Electron Limited, Tokyo (JP)

(72) Inventors: Akira Murata, Koshi (JP); Satoshi Kaneko, Koshi (JP); Kazuki Motomatsu, Koshi (JP); Kazunori Sakamoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 219 days.

(21) Appl. No.: 15/635,388

(22) Filed: Jun. 28, 2017

(65) Prior Publication Data

US 2018/0010252 A1 Jan. 11, 2018

(30) Foreign Application Priority Data

Jul. 5, 2016 (JP) .................................. 2016-133577

(51) Int. Cl.
*C23C 18/16* (2006.01)
*H01L 21/67* (2006.01)
(Continued)

(52) U.S. Cl.
CPC ...... *C23C 18/1675* (2013.01); *C23C 18/1619* (2013.01); *H01L 21/67017* (2013.01); *H01L 21/6719* (2013.01); *H01L 21/67103* (2013.01); *H01L 21/67248* (2013.01); *H01L 21/67253* (2013.01); *H01L 21/67748* (2013.01); *H01L 21/68742* (2013.01); *C23C 18/1882* (2013.01)

(58) Field of Classification Search
CPC .. C23C 18/1619–1632; C23C 18/1675; C23C 18/1882
See application file for complete search history.

(56) References Cited

U.S. PATENT DOCUMENTS 6,220,091 B1 * 4/2001 Chen ................... C23C 16/4482
438/14
2008/0168946 A1 * 7/2008 Nam ................... C23C 16/4485
118/726
(Continued)

FOREIGN PATENT DOCUMENTS

JP 2005-008954 A 1/2005

*Primary Examiner* — Elizabeth A Burkhart
(74) *Attorney, Agent, or Firm* — Pearne & Gordon LLP

(57) ABSTRACT

A substrate processing apparatus can suppress particle generation on a substrate, and can reduce a consumption amount of a processing liquid. A substrate processing apparatus 1 includes a processing chamber 30 having a processing space 31 in which a substrate W is processed; a vaporizing tank 60, configured to store the processing liquid therein, having a vaporization space 61 in which the stored processing liquid is allowed to be vaporized; a decompression driving unit 70 configured to decompress the vaporization space 61; and a control unit 18. The control unit 18 vaporizes the processing liquid into the processing gas by decompressing the vaporization space 61 without through the processing space 31, and then, vaporizes the processing liquid into the processing gas by decompressing the vaporization space 61 through the processing space 31, and supplies an inert gas into the vaporization space 61.

9 Claims, 6 Drawing Sheets

(51) Int. Cl.
*H01L 21/687* (2006.01)
*H01L 21/677* (2006.01)
*C23C 18/18* (2006.01)

(56) References Cited

U.S. PATENT DOCUMENTS

| | | | |
|---|---|---|---|
| 2010/0050867 A1* | 3/2010 | Murata | C23C 16/4485 95/22 |
| 2013/0014697 A1* | 1/2013 | Kanayama | C23C 16/4481 118/712 |
| 2015/0152557 A1* | 6/2015 | Okura | C23C 16/4481 427/8 |
| 2016/0052772 A1* | 2/2016 | Durukan | B67D 7/362 222/1 |

* cited by examiner

SUBSTRATE PROCESSING APPARATUS, SUBSTRATE PROCESSING METHOD AND RECORDING MEDIUM

CROSS-REFERENCE TO RELATED APPLICATION

This application claims the benefit of Japanese Patent Application No. 2016-133577 filed on Jul. 5, 2016, the entire disclosures of which are incorporated herein by reference.

TECHNICAL FIELD

The embodiments described herein pertain generally to a substrate processing apparatus, a substrate processing method and a recording medium.

BACKGROUND

In general, there is known a substrate processing apparatus configured to process a substrate (wafer) by vaporizing a processing liquid. An example of such a substrate processing apparatus may be an apparatus configured to perform a coupling processing. That is, to improve adhesivity and flatness of a metal film formed on the substrate by electroless plating, the coupling processing using a coupling agent (processing liquid) such as a silane coupling agent may be performed prior to forming the metal film.

As a substrate processing apparatus which performs the coupling processing, there is known an apparatus configured to vaporize a liquid coupling agent by heating. This substrate processing apparatus includes a processing chamber configured to place a substrate on a hot plate and process the substrate; and a vaporizer and a vacuum pump connected to the processing chamber. The vaporizer is equipped with a heater for vaporizing the coupling agent. With this configuration, as the coupling agent stored in the vaporizer is vaporized by the heater and supplied into the processing chamber by a suction force of the vacuum pump, the substrate within the processing chamber is coupling-processed.

In case of vaporizing the liquid coupling agent by heating, however, the vaporization may not progress sufficiently, so that mist in a liquid phase may be generated. In such a case, the liquid coupling agent may remain in a pipeline through which the coupling agent is supplied into the processing chamber from the vaporizer. If this residual liquid coupling agent is introduced into the processing chamber, it may adhere to the substrate, causing particle generation on the substrate. Furthermore, since the coupling agent remaining in the pipeline may not contribute to the processing of the substrate, a larger amount of the liquid coupling agent is required to vaporize a sufficient amount of the coupling agent. As a consequence, a consumption amount of the coupling agent used in the vaporizer may be increased.

Patent Document 1: Japanese Patent Laid-open Publication No. 2005-008954

SUMMARY

In view of the foregoing, exemplary embodiments provide a substrate processing apparatus, a substrate processing method and a recording medium capable of suppressing particle generation on a substrate while reducing a consumption amount of a processing liquid.

In one exemplary embodiment, a substrate processing apparatus includes a processing chamber having a processing space in which a substrate is processed; a vaporizing tank, configured to store a processing liquid therein, having a vaporization space in which the stored processing liquid is allowed to be vaporized; a decompression driving unit configured to vaporize the processing liquid stored in the vaporization space into a processing gas by decompressing the vaporization space through the processing space, and configured to supply the vaporized processing gas into the processing space and an inert gas supply unit configured to supply an inert gas into the vaporization space. The vaporization space and the processing space communicate with each other through a first line, and the processing space and the decompression driving unit communicate with each other through a second line. The vaporization space and the decompression driving unit communicate with each other through a third line without through the processing space, and the inert gas supply unit and the vaporization space communicate with each other through a first gas supply line. A first opening/closing valve is provided at the first line; a second opening/closing valve is provided at the second line; a third opening/closing valve is provided at the third line; a first gas opening/closing valve is provided at the first gas supply line. A control unit is configured to control the decompression driving unit, the first opening/closing valve, the second opening/closing valve, the third opening/closing valve and the first gas opening/closing valve. The control unit vaporizes the processing liquid stored in the vaporization space into the processing gas by decompressing the vaporization space without through the processing space while closing the first opening/closing valve and the first gas opening/closing valve and opening the third opening/closing valve, and the control unit then vaporizes the processing liquid stored in the vaporization space into the processing gas by decompressing the vaporization space through the processing space while opening the first opening/closing valve, the second opening/closing valve and the first gas opening/closing valve and closing the third opening/closing valve, and supplies the inert gas into the vaporization space.

In another exemplary embodiment, a substrate processing method includes a carrying-in process of carrying a substrate into a processing space in which the substrate is processed; a storing process of supplying and storing a processing liquid into a vaporization space of a vaporizing tank; a vaporizing process of vaporizing the processing liquid stored in the vaporization space into a processing gas by decompressing the vaporization space without through the processing space; and a supplying process of vaporizing, after the vaporizing process, the processing liquid stored in the vaporization space into the processing gas by decompressing the vaporization space through the processing space and supplying the vaporized processing gas into the processing space. Further, in the supplying process, an inert gas is supplied into the vaporization space.

In still another exemplary embodiment, there is provided a computer-readable recording medium having stored thereon computer-executable instructions that, in response to execution, cause a substrate processing apparatus to perform the substrate processing method as described above.

According to the exemplary embodiments, the particle generation on the substrate can be suppressed, and the consumption amount of the processing liquid can be reduced.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
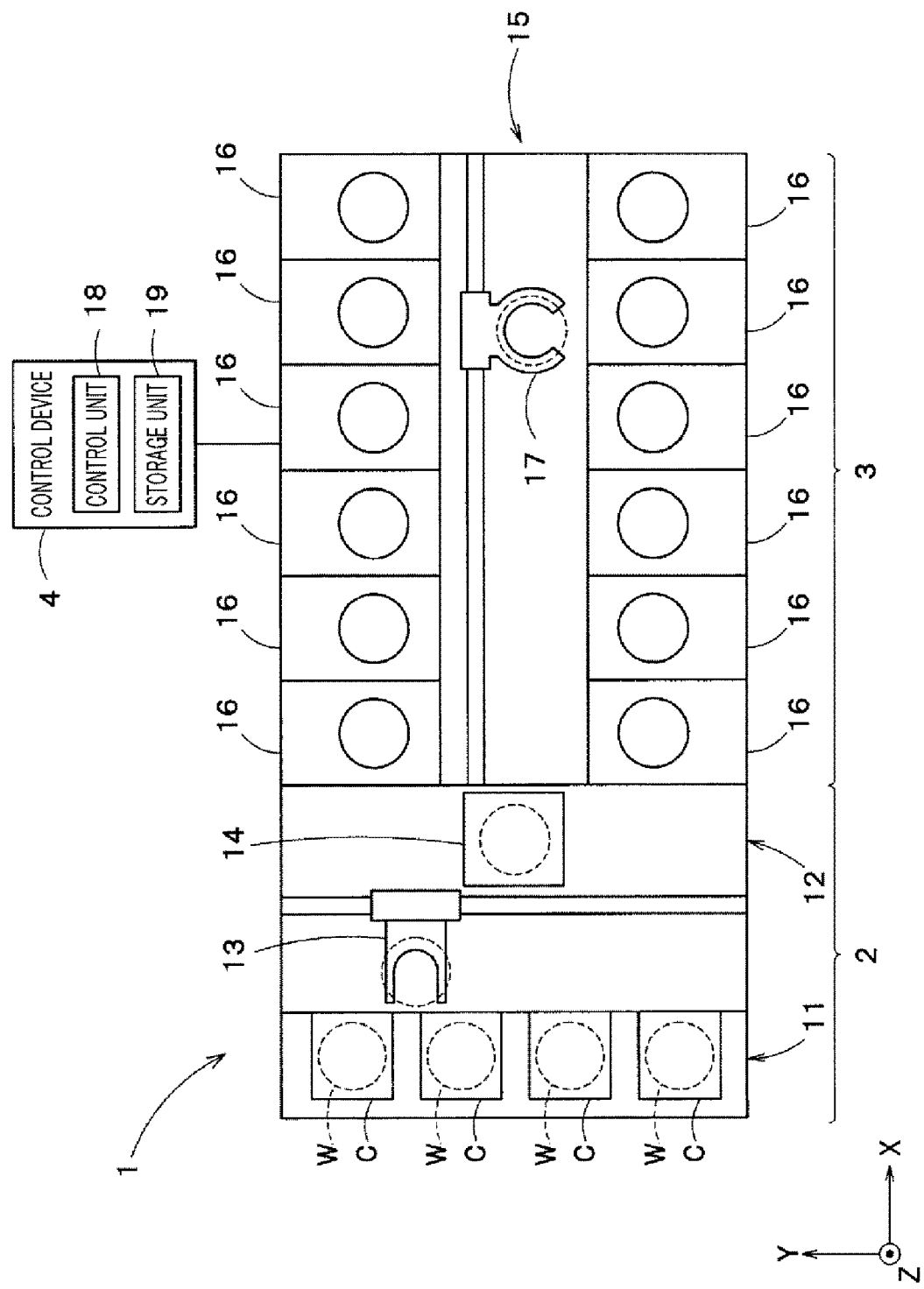
FIG. 1 is a schematic plan view illustrating a configuration of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, an exemplary embodiment of the present disclosure will be explained in detail with reference to the accompanying drawings.

First, referring to FIG. 1, a configuration of a substrate processing apparatus according to the exemplary embodiment will be described. FIG. 1 is a schematic diagram illustrating a configuration of a plating apparatus as an example of the substrate processing apparatus according to the exemplary embodiment.

FIG. 1 is a diagram illustrating a schematic configuration of the substrate processing apparatus according to the exemplary embodiment. In the following description, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing apparatus 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "substrates W") horizontally.

The transfer section 12 is provided adjacent to the carrier placing section 11, and is provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the substrates W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the substrate W. Further, the substrate transfer device 17 is movable horizontally and vertically and pivotable around a vertical axis. The substrate transfer device 17 transfers the substrates W between the delivery unit 14 and the processing units 16 by using the wafer holding mechanism.

The processing units 16 perform a predetermined substrate processing on the substrates W transferred by the substrate transfer device 17.

Further, the substrate processing apparatus 1 is provided with a control device 4. The control device 4 is, for example, a computer, and includes a control unit 18 and a storage unit 19. The storage unit 19 stores a program that controls various processings performed in the substrate processing apparatus 1. The control unit 18 controls the operations of the substrate processing apparatus 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing apparatus 1 configured as described above, the substrate transfer device 13 of the carry-in/out station 2 first takes out a substrate W from a carrier C placed in the carrier placing section 11, and then places the taken substrate W on the delivery unit 14. The substrate W placed on the delivery unit 14 is taken out of the delivery unit 14 by the substrate transfer device 17 of the processing station 3 and carried into a processing unit 16.

The substrate W carried into the processing unit 16 is processed by the processing unit 16, and then, carried out from the processing unit 16 and placed on the delivery unit 14 by the substrate transfer device 17. Then, the processed substrate W placed on the delivery unit 14 is returned back into the carrier C of the carrier placing section 11 by the substrate transfer device 13.

Figure 2:
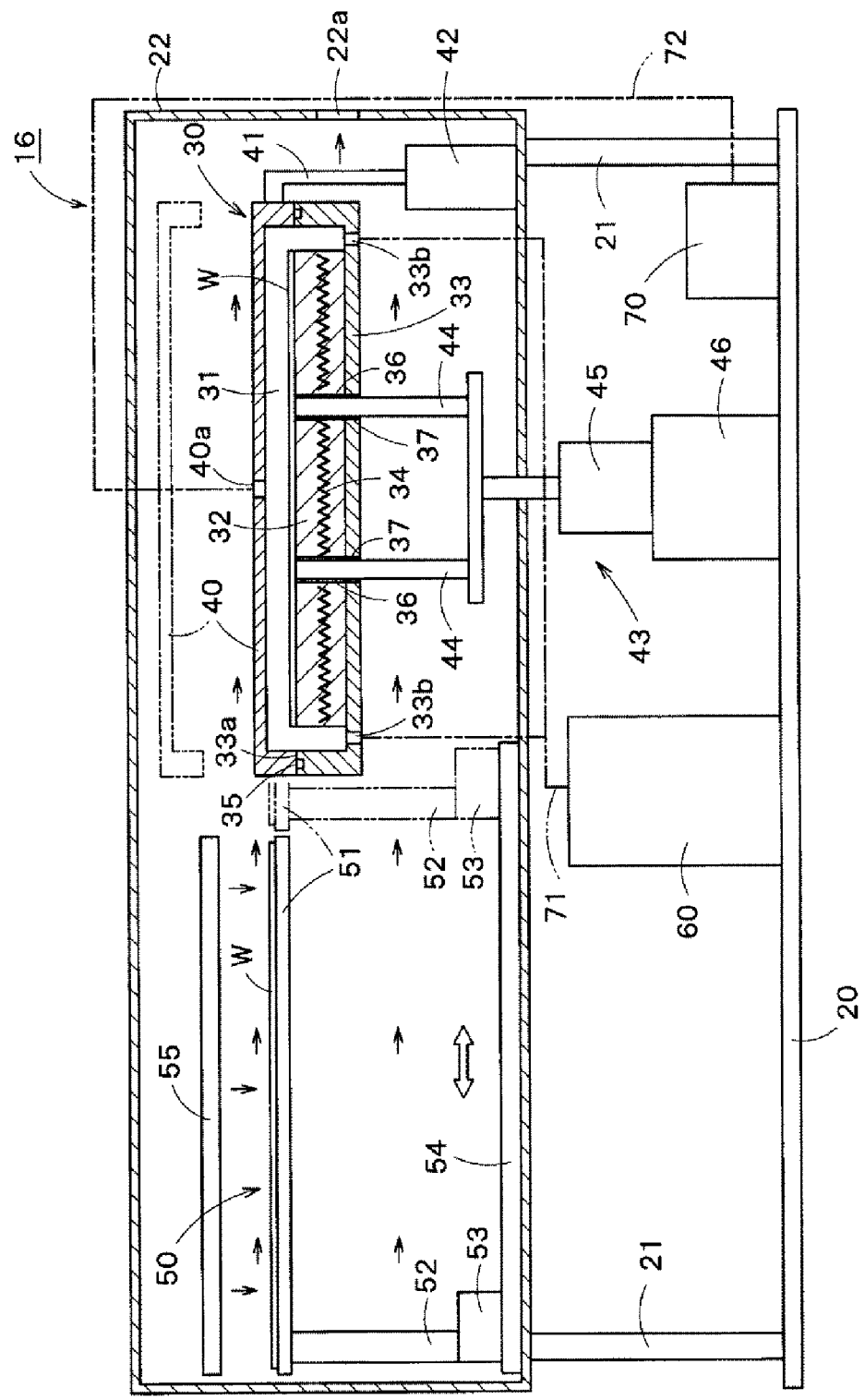
FIG. 2 is a cross sectional view illustrating an internal configuration of a processing unit shown in FIG. 1.

Now, referring to FIG. 2, a configuration of the processing unit 16 according to the present exemplary embodiment will be explained. FIG. 2 is a schematic cross sectional view illustrating an internal configuration of the processing unit 16. Here, an apparatus configured to perform a coupling processing with a silane coupling agent (processing liquid) as a pre-processing for forming a metal film on a substrate W by electroless plating may be described as an example of the processing unit 16, but not limited thereto.

As shown in FIG. 2, the processing unit 16 is equipped with a base 20; a processing vessel 22 fixed to the base 20 with a supporting column 21 therebetween; a processing chamber 30 configured to heat a substrate W; and a temperature control unit 50 configured to control a temperature of the substrate W. Both the processing chamber 30 and the temperature control unit 50 are accommodated in the processing vessel 22 and are arranged in a transversal direction within the processing vessel 22.

The processing chamber 30 has a processing space 31 in which the substrate W is processed. The processing chamber 30 is equipped with a hot plate 32 on which the substrate W is placed; a lower vessel 33 configured to support the hot plate 32; and a cover body 40 configured to cover the substrate W placed on the hot plate 32. The processing space 31 is defined by the lower vessel 33 and the cover body 40.

The hot plate 32 has a heater 34 embedded therein, and the substrate W placed on the hot plate 32 is heated by the heater 34. A heating temperature of the substrate W is controlled by the control unit 18 (see FIG. 1) of the control device 4, and the substrate W placed on the hot plate 32 is heated to a preset temperature of, e.g., 120° C. to 150° C.

The cover body 40 is provided above the lower vessel 33, and is in contact with an upper end surface 33a of the lower vessel 33. A seal ring 35 is provided on the upper end surface 33a of the lower vessel 33, and the processing space 31 of the processing chamber 30 is hermetically sealed by this seal ring 35.

The cover body 40 is connected with a cover body cylinder 42 (cover body elevating unit) with a supporting arm 41 therebetween. The cover body 40 is configured to be movable up and down by the cover body cylinder 42. To be more specific, the cover body 40 is configured to be movable up and down between an upper position (indicated by a dashed double-dotted line in FIG. 2) where the cover body 40 is upwardly spaced apart from the lower vessel 33 and a lower position (indicated by a solid line in FIG. 2) where the cover body 40 is in contact with the upper end surface 33a of the lower vessel 33. The cover body cylinder 42 is mounted to the processing vessel 22.

The substrate W placed on the hot plate 32 is movable up and down by a substrate elevating device 43. The substrate elevating device 43 is equipped with a multiple number of (for example, three) elevating pins 44 configured to support the substrate W from below; and a substrate cylinder 45 (substrate elevation driving unit) configured to move the elevating pins 44 up and down. The hot plate 32 and the lower vessel 33 are respectively provided with through holes 36 and 37 through which the elevating pins 44 are inserted, and each of the elevating pins 44 is configured to be protruded above the hot plate 32 after passing through the through holes 36 and 37. The substrate cylinder 45 is mounted to a fixing member 46 fixed to the base 20.

The temperature control unit 50 is equipped with a temperature control arm 51 on which the substrate W as a target of temperature control is placed. This temperature control arm 51 is connected with a movement driving unit 53 via a supporting arm 52 therebetween. The movement driving unit 53 is movably mounted to a rail 54 which is extended in the transversal direction. The temperature control arm 51 is movable between a temperature control position (indicated by a solid line in FIG. 2) where the temperature control arm 51 is located under an inert gas discharge unit 55 to be described later and a transfer position (indicated by a dashed double-dotted line in FIG. 2) where the temperature control arm 51 is located above the hot plate 32. When the temperature control arm 51 is placed at the temperature control position, the temperature control of the substrate W placed on the temperature control arm 51 is performed, whereas when the temperature control arm 51 is located at the transfer position, the substrate W can be transferred between the temperature control arm 51 and the elevating pins 44. The temperature control arm 51 is configured such that it does not interfere with the elevating pins 44 protruded above the hot plate 32 when the temperature control arm 51 is located at the transfer position.

The temperature control arm 51 has therein a temperature control member (not shown) such as a Peltier element or a temperature control water mechanism (not shown) for flowing temperature control water. A temperature of the temperature control arm 51 is controlled by the control unit 18, and the processed substrate W placed on the temperature control arm 51 is cooled to a preset temperature, e.g., 50° C.

The inert gas discharge unit 55 is provided above the temperature control unit 50. The inert gas discharge unit 55 is configured to discharge an inert gas (e.g., nitrogen ($N_2$) gas) downwards. The discharged inert gas is flown toward an exhaust port 22a provided at the processing vessel 22. In FIG. 2, the exhaust port 22a is provided at a portion (right-hand side portion in FIG. 2) of the processing vessel 22 opposite to the side where the temperature control unit 50 is provided with respect to the processing chamber 30. In this case, the inert gas discharged from an inert gas supply unit 76 is flown toward the exhaust port 22a after passing through the vicinity of the processing chamber 30. The inert gas is supplied to the inert gas discharge unit 55 from the inert gas supply unit 76 (see FIG. 3).

As depicted in FIG. 2, a vaporizing tank 60, which is configured to store a processing liquid and has therein a vaporization space 61 (see FIG. 3) in which the stored processing liquid can be vaporized, is mounted to the base 20. A processing gas vaporized from the processing liquid in the vaporization space 61 is introduced into the processing chamber 30 through an inlet port 33b which is provided at the lower vessel 33 of the processing chamber 30.

A vacuum pump 70 (decompression driving unit) configured to decompress the processing space 31 is connected to the cover body 40 of the processing chamber 30. To elaborate, a suction port 40a is provided at the cover body 40. As an atmosphere of the processing space 31 is sucked by the vacuum pump 70 through the suction port 40a, the processing space 31 is decompressed. The vacuum pump 70 is mounted to the base 20.

Now, a supply system of the processing gas will be described in further detail with reference to FIG. 3. The aforementioned control unit 18 of the control device 4 controls the vacuum pump 70, and controls a first opening/closing valve 71V, a second opening/closing valve 72V, a third opening/closing valve 73V, a first gas opening/closing valve 77V, a second gas opening/closing valve 78V, a first flow rate control valve 77F, a second flow rate control valve 78F, a supply opening/closing valve 80V and a discharge opening/closing valve 85V to be described later. Further, the control unit 18 is configured to control the vacuum pump 70 and the respective valves based on signals transmitted from a processing space pressure sensor 74, a vaporization space pressure sensor 75, a first liquid surface sensor 66 and a second liquid surface sensor 67 to be described later.

Figure 3:
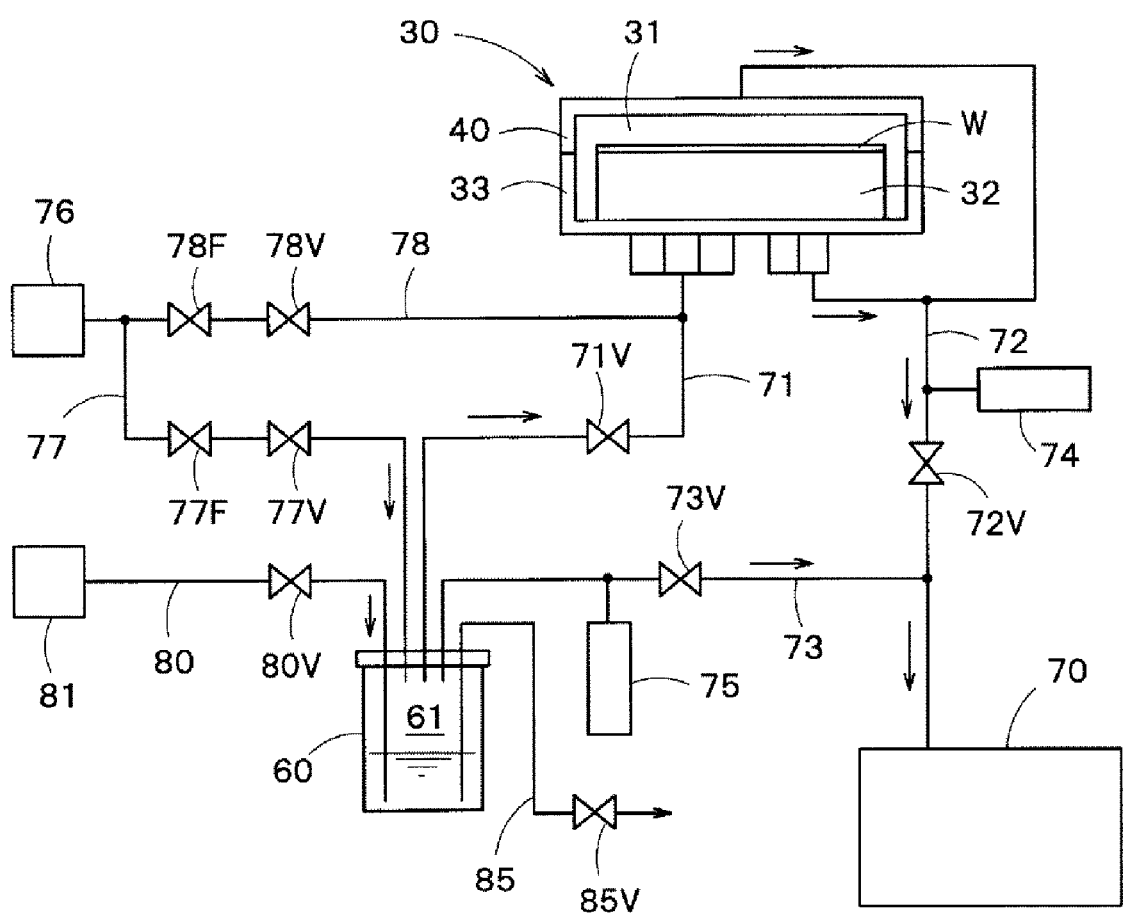
FIG. 3 is a diagram illustrating a supply system of a processing gas in the processing unit of FIG. 1.

As shown in FIG. 3, the vaporization space 61 of the vaporizing tank 60 and the processing space 31 of the processing chamber 30 are allow to communicate with each other through a first line 71. The processing gas vaporized in the vaporization space 61 is supplied into the processing space 31 through the first line 71. The first line 71 is provided with the first opening/closing valve 71V configured to open/close the first line 71. FIG. 3 illustrates an example where the first line 71 is branched into four lines in the vicinity of the processing vessel 22 to supply the processing gas into the processing space 31 uniformly. However, the exemplary embodiment is not limited to this example.

The processing space 31 and the vacuum pump 70 are allowed to communicate with each other through a second line 72. The atmosphere within the processing space 31 is sucked by the vacuum pump 70 through the second line 72 so that the processing space 31 can be decompressed. The second line 72 is provided with the second opening/closing valve 72V configured to open/close the second line 72. In FIG. 3, the second line 72 is connected to the suction port 40a of the cover body 40 and the lower vessel 33. In the vicinity of the lower vessel 33, the second line 72 is branched into three lines, but not limited thereto. Further, the second line 72 is also provided with the processing space pressure sensor 74 configured to measure a pressure of the processing space 31. The processing space pressure sensor 74 is disposed upstream of the second opening/closing valve 72V.

The vaporization space 61 and the vacuum pump 70 are allowed to communicate with each other through a third line 73. The third line 73 bypasses the processing space 31 and allows the vaporization space 61 and the vacuum pump 70 to communicate with each other. An atmosphere within the vaporization space 61 is sucked by the vacuum pump 70 through the third line 73, so that the vaporization space 61 can be decompressed. If the vaporization space 61 is decompressed, the processing liquid stored in the vaporization space 61 is vaporized. The third line 73 is provided with the third opening/closing valve 73V configured to open/close the third line 73 and also provided with the vaporization space pressure sensor 75 configured to measure a pressure of the vaporization space 61. The vaporization space pressure sensor 75 is disposed upstream of the third opening/closing valve 73V.

The control unit 18 of the control device 4 according to the present exemplary embodiment closes the first opening/closing valve 71V while opening the third opening/closing valve 73V, so that the vaporization space 61 is decompressed by the vacuum pump 70 without through the processing space 31. As a result, the processing liquid stored in the vaporization space 61 is vaporized into the processing gas. Thereafter, the control unit 18 opens the first opening/closing valve 71V and the second opening/closing valve 72V while closing the third opening/closing valve 73V, so that the vaporization space 61 is decompressed through the processing space 31. As a result, the processing liquid stored in the vaporization space 61 is vaporized into the processing gas. The vaporized processing gas is supplied into the processing space 31 by being sucked by the vacuum pump 70.

The inert gas is supplied from the inert gas supply unit 76 into the vaporization space 61 of the vaporizing tank 60. The inert gas supply unit 76 and the vaporization space 61 are allowed to communicate with each other through a first gas supply line 77. The first gas supply line 77 is provided with the first gas opening/closing valve 77V configured to open/close the first gas supply line 77 and the first flow rate control valve 77F configured to control a flow rate of the inert gas flowing through the first gas supply line 77. A supply amount of the inert gas into the vaporization space 61 can be adjusted by the first flow rate control valve 77F. In FIG. 3, the first gas opening/closing valve 77V is shown to be provided downstream of the first flow rate control valve 77F. However, the exemplary embodiment is not limited to this example.

The control unit 18 of the control device 4 according to the present exemplary embodiment closes the first gas opening/closing valve 77V when the aforementioned third opening/closing valve 73V is opened and the vacuum pump 70 decompresses the vaporization space 61 without through the processing space 31. Further, the control unit 18 opens the first gas opening/closing valve 77V and supplies the inert gas into the vaporization space 61 when the first opening/closing valve 71V and the second opening/closing valve 72V are opened and the vacuum pump 70 decompresses the vaporization space 61 through the processing space 31. The inert gas supplied into the vaporization space 61 is introduced into the processing space 31 along with the processing gas.

The flow rate of the inert gas supplied into the vaporization space 61 is adjusted by the first flow rate control valve 77F to a required flow rate. The supply amount of the inert gas may be appropriately set based on a capacity of the vacuum pump 70. By way of example, it may be desirable to adjust the supply amount of the inert gas to the extent that a pressure of the vaporization space 61 sucked by the vacuum pump 70 can be maintained at several kPa. In this case, it may be possible to suppress a decrease of the vaporization rate from the processing liquid into the processing gas within the vaporization space 61.

The inert gas supply unit 76 is also allowed to communicate with the processing space 31 through the second gas supply line 78. The second gas supply line 78 bypasses the vaporization space 61 and allows the inert gas supply unit 76 and the processing space 31 to communicate with each other. The inert gas is directly supplied into the processing space 31 from the inert gas supply unit 76 through this second gas supply line 78. The second gas supply line 78 is provided with the second gas opening/closing valve 78V configured to open/close the second gas supply line 78 and the second flow rate control valve 78F configured to adjust a flow rate of the inert gas flowing through the second gas supply line 78. A supply amount of the inert gas into the processing space 31 can be adjusted by the second flow rate control valve 78F. In FIG. 3, the second gas opening/closing valve 78V is illustrated to be provided downstream of the second flow rate control valve 78F, but not limited thereto.

Furthermore, as depicted in FIG. 3, a processing liquid supply line 80 through which the processing liquid is supplied into the vaporizing tank 60 is connected to the vaporizing tank 60. One end of the processing liquid supply line 80 is connected with a processing liquid supply unit 81, and the processing liquid is supplied into the vaporizing tank 60 from the processing liquid supply unit 81 through the processing liquid supply line 80. The processing liquid supply line 80 is provided with the supply opening/closing valve 80V configured to open/close the processing liquid supply line 80. Meanwhile, the processing liquid drain line 85 through which the processing liquid stored in the vaporization space 61 is drained is connected to the vaporizing tank 60. The processing liquid drain line 85 is provided with the discharge opening/closing valve 85V configured to open/close the processing liquid drain line 85.

Figure 4:
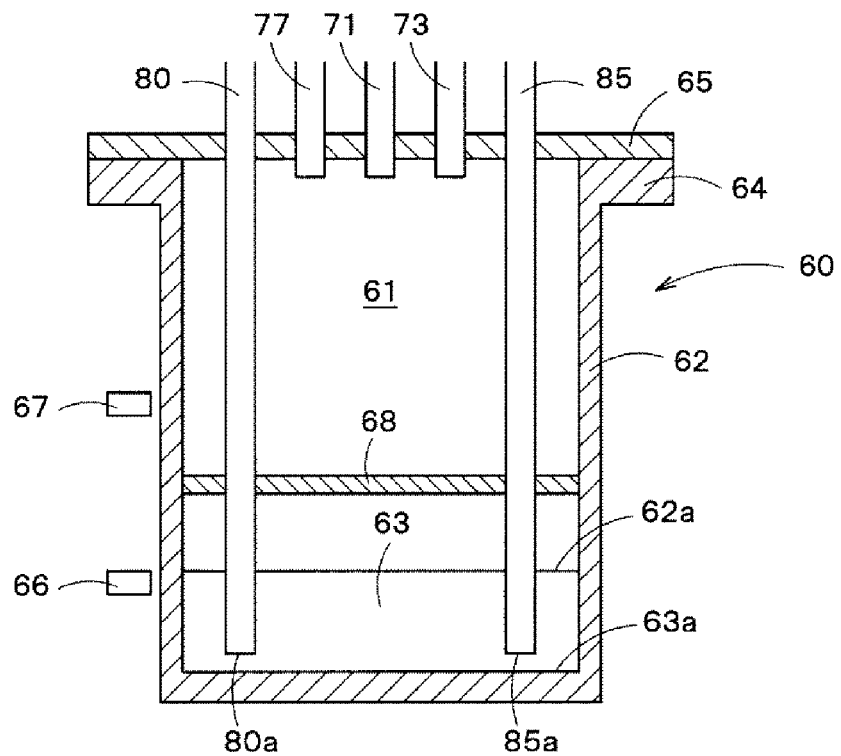
FIG. 4 is a cross sectional view illustrating a vaporizing tank of FIG. 3.
Figure 5:
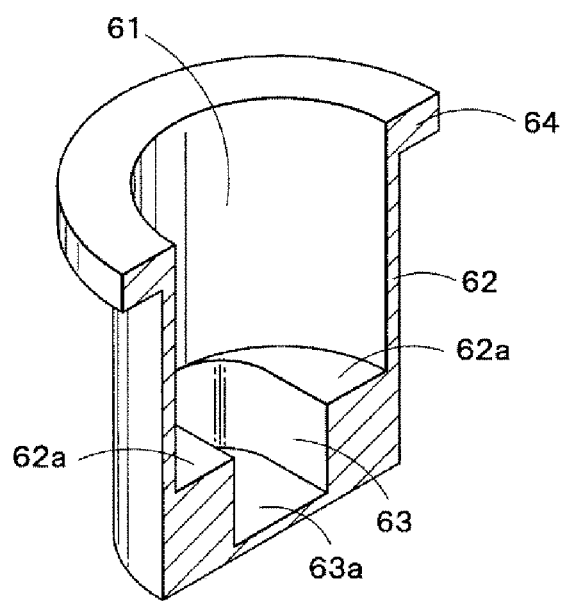
FIG. 5 is a perspective cross sectional view illustrating a tank main body of the vaporizing tank of FIG. 4.
Figure 6:
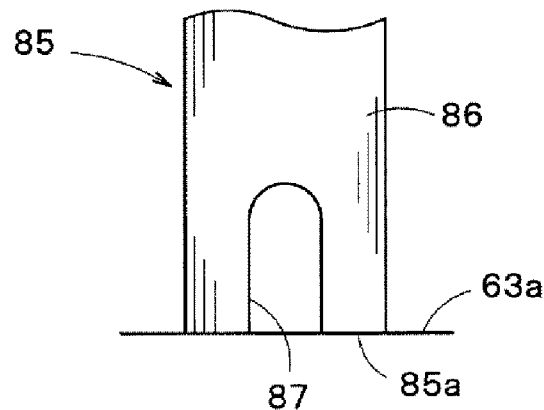
FIG. 6 is a partially enlarged view illustrating a processing liquid drain line shown in FIG. 4.

Now, referring to FIG. 4 to FIG. 6, the vaporizing tank 60 will be elaborated in further detail.

As depicted in FIG. 4 and FIG. 5, the vaporizing tank 60 includes a tank main body 62 having a main body bottom surface 62*a*; and a recess 63 formed at the main body bottom surface 62*a*. The recess 63 includes a recess bottom surface 63*a* provided at a position lower than the main body bottom surface 62*a*. The tank main body 62 according to the present exemplary embodiment has a cylindrical shape, and, when viewed from above, the recess 63 is extended in a straight line shape while passing through a center of the main body bottom surface 62*a*. When viewed from above, the main body bottom surface 62*a* remains at both sides of the recess 63.

The tank main body 62 is provided with a flange 64. A cover 65 configured to cover the tank main body 62 is provided to the flange 64. The aforementioned vaporization space 61 is defined by the cover 65 and the tank main body 62. A non-illustrated seal ring 35 is provided between the flange 64 and the cover 65, so that the vaporization space 61 is hermetically sealed.

As shown in FIG. 4, an outlet end 80*a* of the aforementioned processing liquid supply line 80 is disposed within the recess 63 of the vaporizing tank 60. Since the outlet end 80*a* is inserted deep into the recess 63, the processing liquid stored in the vaporization space 61 can be suppressed from being mixed with air bubbles. Further, an inlet end 85*a* of the processing liquid drain line 85 is also disposed and inserted deep into the recess 63. In this configuration, when the processing liquid is drained from the vaporizing tank 60, it is possible to suppress the processing liquid in the vaporization space 61 from being left.

Particularly, according to the present exemplary embodiment, as shown in FIG. 6, the processing liquid drain line 85 includes an inlet end side pipeline 86 provided within the vaporizing tank 60, and a notch portion 87 extended upwards from the inlet end 85*a* is formed at the inlet end side pipeline 86. In this case, as shown in FIG. 6, even in case that the inlet end 85*a* (bottom end) of the inlet end side pipeline 86 is in contact with the recess bottom surface 63*a*, the processing liquid can still be drained. Therefore, the processing liquid can be further suppressed from remaining in the vaporization space 61. Furthermore, in the example shown in FIG. 6, the notch portion 87 is upwardly extended in a straight line shape. However, the shape of the notch portion 87 is not limited to the shown example as long as the inlet end 85*a* is notched.

As illustrated in FIG. 4, the vaporizing tank 60 includes the first liquid surface sensor 66 and the second liquid surface sensor 67 configured to detect a liquid surface of the processing liquid stored in the vaporization tank 60. The second liquid surface sensor 67 is provided at a position higher than the first liquid surface sensor 66. That is, the first liquid surface sensor 66 is configured to detect the liquid surface of the processing liquid at a relatively low position, whereas the second liquid surface sensor 67 is configured to detect the liquid surface of the processing liquid at a relatively high position.

As depicted in FIG. 4, a scattering prevention plate 68 (scattering prevention member) configured to suppress scattering of the processing liquid is provided between the height position of the first liquid surface sensor 66 and the height position of the second liquid surface sensor 67. The scattering prevention plate 68 is formed to partition the vaporization space 61 of the vaporizing tank 60 into a lower space (a space under the scattering prevention plate 68) and an upper space (a space above the scattering prevention plate 68). With this configuration, in case that the liquid surface of the processing liquid is located under the scattering prevention plate 68, misdetection of the liquid surface of the processing liquid by the second liquid surface sensor 67 because of splashing of the processing liquid being supplied or waving of the liquid surface of the processing liquid can be suppressed. Meanwhile, the scattering prevention plate 68 is provided with a communication hole (not shown) for allowing the processing liquid to pass therethrough to be introduced into the upper space. The communication hole is set to have a size capable of suppressing the splashing of the processing liquid or the waving of the liquid surface.

Figure 7:
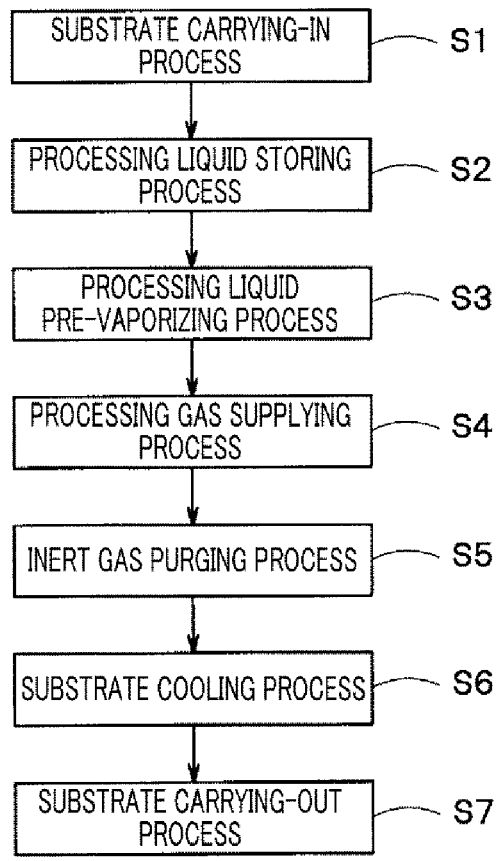
FIG. 7 is a flowchart for describing a substrate processing method according to the present exemplary embodiment.

Now, an operation of the present exemplary embodiment having the above-described configuration will be explained with reference to FIG. 7. A substrate processing method performed on a substrate W by the processing unit 16 according to the present exemplary embodiment includes a processing of heating the substrate W under a processing gas atmosphere fully filled with the processing gas vaporized from the processing liquid. An operation of the processing unit 16 to be described below is controlled by the control unit 18 of the control device 4.

[Substrate Carrying-in Process]

First, a substrate W is carried into the processing space 31 of the processing chamber 30 (process 51). In this case, the substrate W is carried into the processing vessel 22 of the processing unit 16 and placed on the temperature control arm 51 of the temperature control unit 50. At this time, the temperature control arm 51 is placed at the temperature control position indicated by the solid line in FIG. 2. Then, as the movement driving unit 53 of the temperature control unit 50 is driven, the temperature control arm 51 is moved along the rail 54 from the temperature control position to the transfer position (indicated by the dashed double-dotted line in FIG. 2). Next, the substrate W is handed over onto the elevating pins 44 of the substrate elevating device 43 protruded above the hot plate 32, and the temperature control arm 51 is retreated back to the temperature control position from the transfer position. Thereafter, the substrate cylinder 45 is driven, so that the elevating pins 44 are lowered and the substrate W is placed on the hot plate 32. Afterwards, as the cover body cylinder 42 is driven, the cover body 40 located at the upper position (indicated by the dashed double-dotted line in FIG. 2) is lowered to the lower position (indicated by the solid line in FIG. 2) and brought into contact with the upper end surface 33*a* of the lower vessel 33. The cover body 40 and the lower vessel 33 form the processing space 31 which is hermetically sealed.

[Processing Liquid Storing Process]

After (or concurrently with, or before) the substrate carrying-in process, a processing liquid is supplied into and stored in the vaporization space 61 of the vaporizing tank 60 (process S2). By way of example, if it is detected by the first liquid surface sensor 66 that the processing liquid is not stored up to the position of the first liquid surface sensor 66, it is appropriate to supply the processing liquid into the vaporization space 61. In this case, the supply opening/closing valve 80V shown in FIG. 3 is opened, and the processing liquid is supplied from the processing liquid supply unit 81 into the vaporizing tank 60 through the processing liquid supply line 80. The supplied processing liquid is stored in the vaporization space 61, so that a liquid surface of the processing liquid rises. While the processing liquid is being supplied, the splashing or scattering of the processing liquid introduced from the outlet end 80*a* and the waving of the liquid surface of the stored processing liquid can be suppressed since the outlet end 80a of the processing liquid supply line 80 is disposed within the recess 63 of the vaporizing tank 60. Further, since the scattering prevention plate 68 is provided with the communication hole (not shown), the liquid surface of the processing liquid can further rise even if the liquid surface of the processing liquid reaches the scattering prevention plate 68. If the liquid surface of the processing liquid reaches the position of the second liquid surface sensor 67, the arrival of the processing liquid is detected by the second liquid surface sensor 67, and the supply opening/closing valve 80V is closed. As a result, the supply of the processing liquid is stopped, and a required amount of the processing liquid can be stored in the vaporization space 61.

[Processing Liquid Pre-vaporizing Process]

After the substrate carrying-in process and the processing liquid storing process, the vaporization space 61 is decompressed without through the processing space 31, so that the processing liquid stored in the vaporization space 61 is vaporized into a processing gas (process S3). In this case, the vacuum pump 70 shown in FIG. 3 is driven, and the third opening/closing valve 73V is opened. Accordingly, the vaporization space 61 and the vacuum pump 70 communicate with each other, and an atmosphere within the vaporization space 61 is sucked by the vacuum pump 70, so that the vaporization space 61 is decompressed. If the vaporization space 61 is decompressed, the stored processing liquid is vaporized, so that the vaporization space 61 is filled with the processing gas. As the processing liquid is vaporized, a pressure of the processing gas within the vaporization space 61 increases and reaches a saturated vapor pressure. If the saturated vapor pressure is reached, the process progresses from the processing liquid pre-vaporizing process to a processing gas supplying process to be described below. The pressure of the processing gas within the vaporization space 61 is measured by the vaporization space pressure sensor 75. Further, in the processing liquid pre-vaporizing process, the first gas opening/closing valve 77V is closed.

[Processing Gas Supplying Process]

After the processing liquid pre-vaporizing process, the vaporization space 61 is decompressed through the processing space 31, and the processing gas within the vaporization space 61 is supplied into the processing space 31 (process S4). In this case, the vacuum pump 70 is driven, and the first opening/closing valve 71V and the second opening/closing valve 72V are opened whereas the third opening/closing valve 73V is closed. Accordingly, the vaporization space 61 and the processing space 31 communicate with each other and the processing space 31 and the vacuum pump 70 communicate each other, so that the atmosphere of the vaporization space 61 is sucked by the vacuum pump 70 through the processing space 31. For this reason, the processing gas within the vaporization space 61 is supplied into the processing space 31, and an atmosphere within the processing space 31 is replaced by the processing gas atmosphere. During the processing gas supplying process, since the vaporization space 61 is kept being decompressed by the vacuum pump 70, the processing liquid stored in the vaporization space 61 is kept being vaporized into the processing gas, so that the processing gas is continuously supplied into the processing space 31.

While the processing gas is being supplied into the processing space 31, the substrate W within the processing space 31 is heated by the hot plate 32. Accordingly, the substrate W is processed by the processing gas. By way of example, in case that the processing liquid is a silane coupling agent, a vaporized silane coupling agent adheres to the substrate W, so that a silane-based coupling layer (not shown) is formed on the substrate W. The silane-based coupling layer is formed of a self-assembled monolayer (SAM) originated from the silane coupling agent and serves to improve adhesivity and flatness of a metal film formed in an electroless plating process as a post-process. The supply of the processing gas into the processing space 31 is performed for a preset time period, so that a desired thickness of the silane-based coupling layer can be obtained.

Furthermore, in the processing gas supplying process, the inert gas is supplied into the vaporization space 61 from the inert gas supply unit 76. That is, the first gas opening/closing valve 77V and the first flow rate control valve 77F shown in FIG. 3 are opened, so that the inert gas supply unit 76 and the vaporization space 61 communicate with each other. Accordingly, the inert gas is supplied into the vaporization space 61 from the inert gas supply unit 76. The supplied inert gas functions as a carrier gas, and the processing gas within the vaporization space 61 is supplied into the processing space 31 along with the inert gas. Therefore, the supply amount of the processing gas into the processing space 31 can be increased. Furthermore, since the vaporization of the processing liquid into the processing gas within the vaporization space 61 can be accelerated, the supply amount of the processing gas supplied into the processing space 31 can be further increased.

In the processing liquid pre-vaporizing process and the processing gas supplying process, however, the inert gas is discharged into the processing vessel 22 from the inert gas discharge unit 55 shown in FIG. 2. To elaborate, the inert gas is supplied into the inert gas discharge unit 55 from the inert gas supply unit 76, and then, the inert gas is discharged into the processing vessel 22 from the inert gas discharge unit 55. The discharged inert gas flows toward the exhaust port 22a after passing through the vicinity of the processing chamber 30. As a result, the vicinity of the processing chamber 30 can be turned into the low oxygen atmosphere, so that an introduction of oxygen into the processing space 31 can be suppressed.

[Inert Gas Purging Process]

After the processing gas supplying process, the inert gas is purged in the processing space 31 (process S5). In this case, the vacuum pump 70 shown in FIG. 3 is first stopped, and the first opening/closing valve 71V, the second opening/closing valve 72V and the first gas opening/closing vale 77V are closed. Subsequently, the second gas opening/closing valve 78V and the second flow rate control valve 78F are opened, so that the inert gas supply unit 76 and the processing space 31 are allowed to communicate with each other without through the vaporization space 61. Then, the inert gas is supplied into the processing space 31. Accordingly, the pressure of the inert gas within the processing space 31 is increased, and at a time when the internal pressure of the processing space 31 reaches the atmospheric pressure, the second gas opening/closing valve 78V is closed. The internal pressure of the processing space 31 is measured by the processing space pressure sensor 74.

[Substrate Cooling Process]

After the inert gas purging process, the substrate W is cooled (process S6). In this case, the cover body cylinder 42 is first driven, and the cover body 40 located at the lower position is raised to the upper position. Subsequently, as the substrate cylinder 45 is driven, the elevating pins 44 are raised, so that the substrate W is upwardly spaced apart from the hot plate 32. Then, as the movement driving unit 53 of the temperature control unit 50 is driven, the temperature control arm 51 retreated at the temperature control position is placed at the transfer position, and the substrate W is handed over onto the temperature control arm 51. Thereafter, the temperature control arm 51 having received the substrate W is moved from the transfer position to the temperature control position.

If the temperature control arm 51 is placed at the temperature control position, the temperature control of the substrate W is performed by the non-illustrated temperature control member. By way of example, since the temperature of the processed substrate W is increased by being heated by the hot plate 32, the substrate W is cooled by the temperature control member. In this substrate cooling process as well, the inert gas is discharged into the processing vessel 22 from the inert gas discharge unit 55.

[Substrate Carrying-out Process]

After the substrate cooling process, the substrate W is carried out of the processing vessel 22 (process S7).

As stated above, the series of processing method (process S1 to process S7) using the processing unit 16 is ended.

As discussed above, according to the present exemplary embodiment, by decompressing the vaporization space 61 through the processing space 31, the processing gas vaporized from the processing liquid stored in the vaporization space 61 is supplied into the processing space 31. Accordingly, since the processing gas vaporized from the processing liquid can be supplied into the processing space 31 from the vaporization space 61, the processing liquid in a liquid phase can be suppressed from remaining in the first line 71. Therefore, it is possible to suppress particle generation that might be caused as the remaining processing liquid is introduced into the processing space 31 and adheres to the substrate W. In this case, an amount of the processing liquid that does not contribute to the processing of the substrate W can be reduced, so that a consumption amount of the processing liquid can be reduced.

Further, according to the present exemplary embodiment, when supplying the processing gas into the processing space 31, the inert gas is supplied into the vaporization space 61. Accordingly, the processing gas within the vaporization space 61 can be supplied into the processing space 31 along with the inert gas. Therefore, the supply amount of the processing gas into the processing space 31 can be increased, and the atmosphere within the processing space 31 can be rapidly turned into the processing gas atmosphere, so that a processing time of the substrate W can be shortened. Moreover, the vaporization of the processing liquid into the processing gas in the vaporization space 61 can be accelerated, so that the supply amount of the processing gas into the processing space 31 can be further increased.

In addition, according to the present exemplary embodiment, prior to supplying the processing gas into the processing space 31, the vaporization space 61 is decompressed without through the processing space 31, so that the processing liquid stored in the vaporization space 61 is vaporized into the processing gas. Accordingly, at an initial stage of supplying the processing gas into the processing space 31, the supply amount of the processing gas supplied into the processing space 31 can be increased. Hence, the atmosphere of the processing space 31 can be more rapidly replaced by the processing gas atmosphere, so that the processing time of the substrate W can be further shortened.

Furthermore, according to the present exemplary embodiment, the scattering prevention plate 68 configured to suppress the scattering of the processing liquid is provided between the height position of the first liquid surface sensor 66 and the height position of the second liquid surface sensor 67 of the vaporizing tank 60. With this configuration, when supplying the processing liquid into the vaporizing tank 60, in case that the liquid surface of the processing liquid is located under the scattering prevention plate 68, the misdetection of the liquid surface of the processing liquid by the second liquid surface sensor 67 because of the splashing of the processing liquid being supplied or the waving of the liquid surface of the processing liquid can be suppressed. Thus, accuracy of the storage amount of the processing liquid into the vaporizing tank 60 can be improved.

Additionally, according to the present exemplary embodiment, the outlet end 80a of the processing liquid supply line 80, through which the processing liquid is supplied into the vaporizing tank 60, is disposed within the recess 63 of the vaporizing tank 60. Accordingly, the processing liquid supplied from the outlet end 80a can be suppressed from being splashed or scattered, and the waving of the liquid surface of the stored processing liquid can be also be suppressed. Therefore, the misdetection of the liquid surface of the processing liquid by the second liquid surface sensor 67 can be further suppressed, so that the accuracy of the storage amount of the processing liquid in the vaporizing tank 60 can be improved.

Moreover, according to the present exemplary embodiment, the inlet end 85a of the processing liquid drain line 85 configured to drain the processing liquid stored in the vaporizing tank 60 is disposed within the recess 63 of the vaporizing tank 60. Accordingly, in case of draining the processing liquid from the vaporizing tank 60, it is possible to suppress the processing liquid in the vaporization space 61 from being left. Particularly, according to the present exemplary embodiment, the notch portion 87 extended upwards from the inlet end 85a is provided at the inlet end side pipeline 86 of the processing liquid drain line 85. Accordingly, even in case that the inlet end 85a of the inlet end side pipeline 86 is in contact with the recess bottom surface 63a, the processing liquid can be still drained, and the processing liquid in the vaporization space 61 can be further suppressed from being left.

Figure 8:
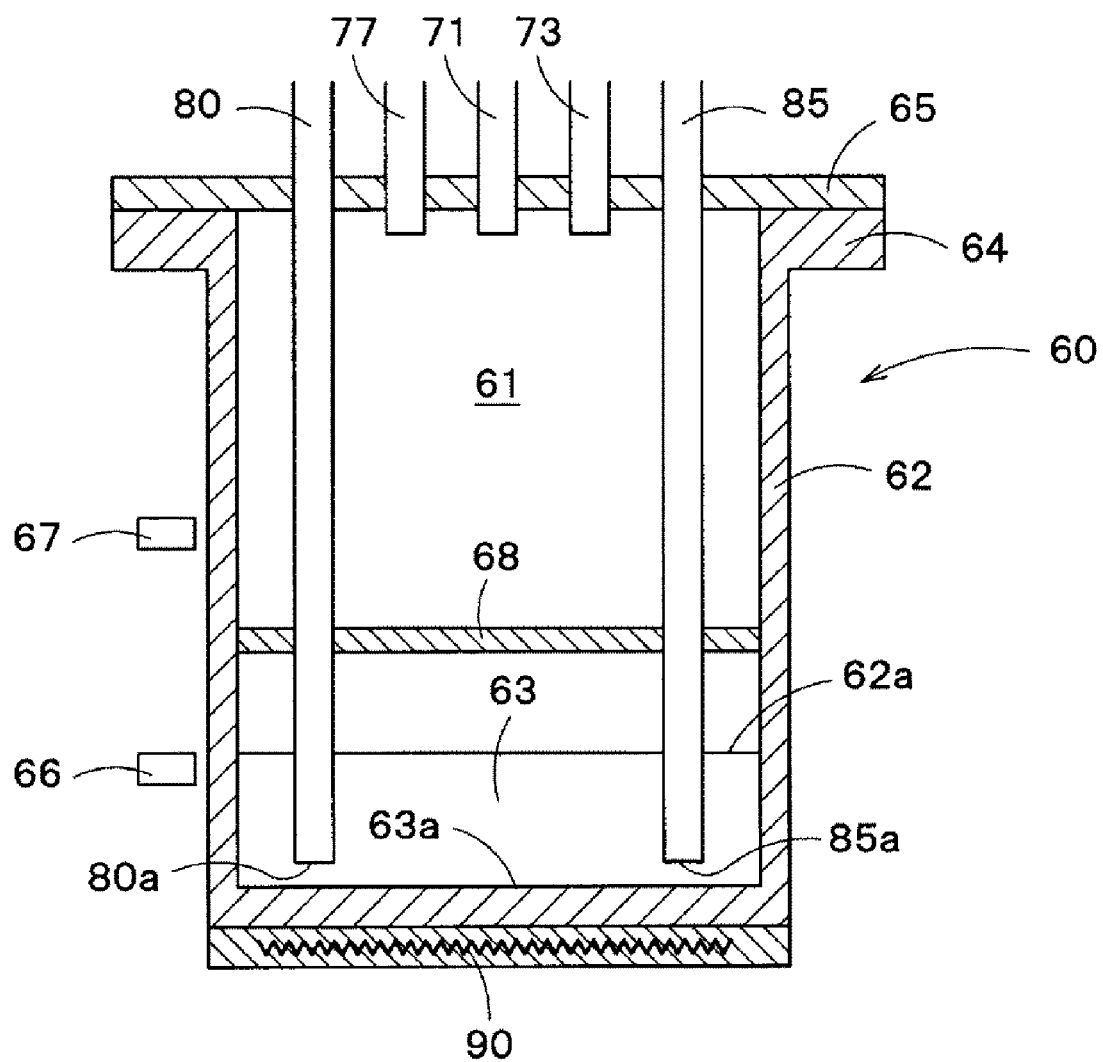
FIG. 8 is a cross sectional view illustrating a modification example of the vaporizing tank shown in FIG. 3.

Further, in the above-described exemplary embodiment, the vaporizing tank 60 may be heated by a tank heater 90 (tank heating unit), as illustrated in FIG. 8. In this case, the saturated vapor pressure of the processing gas within the vaporizing tank 60 can be increased, and the vaporization of the processing liquid stored in the vaporization space 61 can be accelerated, so that the processing gas within the vaporizing tank 60 can be increased. Therefore, the supply amount of the processing gas into the processing space 31 can be further increased.

Furthermore, the above exemplary embodiment has been described for the example where the inert gas is supplied into the vaporization space 61 from the inert gas supply unit 76 in the processing gas supplying process (process S4). However, the exemplary embodiment is not limited thereto, and the inert gas may not be supplied into the vaporization space 61 in the processing gas supplying process. Even in this case, since the vaporization space 61 is decompressed through the processing space 31 by the vacuum pump 70, the processing gas vaporized in the vaporization space 61 can still be supplied into the processing space 31.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
   a processing chamber having a processing space in which a substrate is processed;
   a vaporizing tank, configured to store a processing liquid therein, having a vaporization space in which the stored processing liquid is allowed to be vaporized;
   a decompression driving unit configured to vaporize the processing liquid stored in the vaporization space into a processing gas by decompressing the vaporization space through the processing space, and configured to supply the vaporized processing gas into the processing space;
   an inert gas supply unit configured to supply an inert gas into the vaporization space;
   a first line through which the vaporization space and the processing space communicate with each other;
   a second line through which the processing space and the decompression driving unit communicate with each other;
   a third line through which the vaporization space and the decompression driving unit communicate with each other without through the processing space;
   a first gas supply line through which the inert gas supply unit and the vaporization space communicate with each other;
   a first opening/closing valve provided at the first line;
   a second opening/closing valve provided at the second line;
   a third opening/closing valve provided at the third line;
   a first gas opening/closing valve provided at the first gas supply line; and
   a control unit configured to control the decompression driving unit, the first opening/closing valve, the second opening/closing valve, the third opening/closing valve and the first gas opening/closing valve,
   wherein the control unit vaporizes the processing liquid stored in the vaporization space into the processing gas by decompressing the vaporization space without through the processing space while closing the first opening/closing valve and the first gas opening/closing valve and opening the third opening/closing valve such that the vaporization space is filled with the processing gas and a pressure of the processing gas within the vaporization space increases, and
   the control unit then vaporizes the processing liquid stored in the vaporization space into the processing gas by decompressing the vaporization space through the processing space while opening the first opening/closing valve, the second opening/closing valve and the first gas opening/closing valve and closing the third opening/closing valve, and simultaneously supplies the inert gas into the vaporization space.

2. The substrate processing apparatus of claim 1, further comprising:
   a first flow rate control valve provided at the first gas supply line and configured to control a flow rate of the inert gas.

3. The substrate processing apparatus of claim 1,
   wherein the vaporizing tank comprises a first liquid surface sensor configured to detect a liquid surface of the processing liquid stored therein; and a second liquid surface sensor provided at a position higher than the first liquid surface sensor and configured to detect the liquid surface of the processing liquid, and
   a scattering prevention member configured to suppress scattering of the processing liquid is provided between a height position of the first liquid surface sensor and a height position of the second liquid surface sensor.

4. The substrate processing apparatus of claim 1, further comprising:
   a tank heating unit configured to heat the vaporizing tank.

5. The substrate processing apparatus of claim 1,
   wherein the vaporizing tank has a main body bottom surface and a recess formed at the main body bottom surface,
   a processing liquid supply line through which the processing liquid is supplied is connected to the vaporizing tank, and
   an outlet end of the processing liquid supply line is disposed within the recess of the vaporizing tank.

6. The substrate processing apparatus of claim 1,
   wherein the vaporizing tank has a main body bottom surface and a recess formed at the main body bottom surface,
   a processing liquid drain line through which the stored processing liquid is drained is connected to the vaporizing tank, and
   an inlet end of the processing liquid drain line is disposed within the recess of the vaporizing tank.

7. The substrate processing apparatus of claim 6,
   wherein the processing liquid drain line includes an inlet end side pipeline provided within the vaporizing tank, and
   a notch portion extended from the inlet end is provided at the inlet end side pipeline.

8. A substrate processing method performed by the substrate processing apparatus as claimed in claim 1, comprising:
   a carrying-in process of carrying the substrate into the processing space in which the substrate is processed;
   a storing process of supplying and storing the processing liquid into the vaporization space of the vaporizing tank;
   a vaporizing process of vaporizing the processing liquid stored in the vaporization space into the processing gas by decompressing the vaporization space without through the processing space such that the vaporization space is filled with the processing gas and the pressure of the processing gas within the vaporization space increases; and
   a supplying process of vaporizing, after the vaporizing process, the processing liquid stored in the vaporization space into the processing gas by decompressing the vaporization space through the processing space, supplying the vaporized processing gas into the processing space, and simultaneously supplying the inert gas into the vaporization space.

9. A computer-readable recording medium having stored thereon computer-executable instructions that, in response to execution, cause a substrate processing apparatus to perform a substrate processing method as claimed in claim 8.

* * * * *